United States Patent [19]
Furutani et al.

[11] Patent Number: 6,091,648
[45] Date of Patent: Jul. 18, 2000

[54] VOLTAGE GENERATING CIRCUIT FOR SEMICONDUCTOR INTEGRATED CIRCUIT DEVICE

[75] Inventors: Kiyohiro Furutani; Katsuyoshi Mitsui, both of Hyogo, Japan

[73] Assignee: Mitsubishi Denki Kabushiki Kaisha, Tokyo, Japan

[21] Appl. No.: 09/145,141

[22] Filed: Sep. 1, 1998

[30] Foreign Application Priority Data

Mar. 4, 1998 [JP] Japan .................................. 10-051679

[51] Int. Cl.[7] ...................................................... G11C 7/00
[52] U.S. Cl. .............................. 365/189.11; 365/189.09; 365/205
[58] Field of Search ........................ 365/189.11, 189.09, 365/205, 207, 208

[56] References Cited

U.S. PATENT DOCUMENTS

| | | |
|---|---|---|
| 5,337,284 | 8/1994 | Cordoba et al. . |
| 5,657,290 | 8/1997 | Churcher ............................ 365/189.09 |
| 5,708,616 | 1/1998 | Choi ................................... 365/189.09 |
| 5,943,274 | 8/1999 | Roth et al. ......................... 365/189.11 |

FOREIGN PATENT DOCUMENTS

| | | |
|---|---|---|
| 3-214669 | 9/1991 | Japan . |
| 6-215571 | 8/1994 | Japan . |
| 7-14384 | 1/1995 | Japan . |

*Primary Examiner*—Vu A. Le
*Attorney, Agent, or Firm*—McDermott, Will & Emery

[57] ABSTRACT

A semiconductor integrated circuit includes a node for the power supply voltage for array that is connected to a sense amplifier, a decoupling capacitance connected to the node for the power supply voltage for array, a voltage-down converter connected to the node for the power supply voltage for array and generating a largest voltage stored in a memory cell, and two voltage-down converters connected to the node for the power supply voltage for array and generating a voltage higher than the largest voltage, and boosts the voltage of the node for the power supply voltage for array to attain a voltage higher than the largest voltage in the stand-by state and activates the voltage-down converter generating the largest voltage in operation.

2 Claims, 18 Drawing Sheets

FIG. 8A ext./RAS
FIG. 8B /RAS
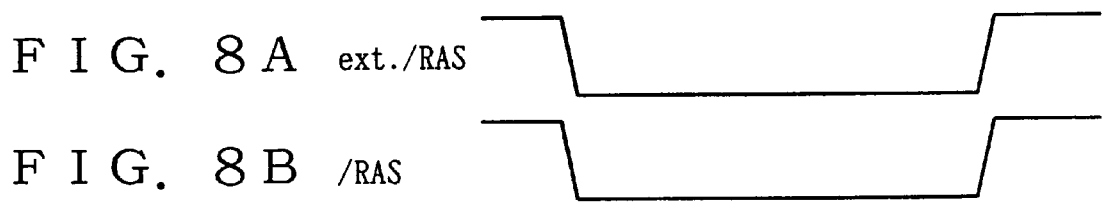
FIG. 9
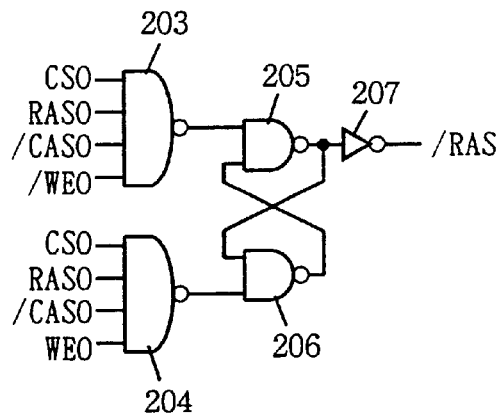

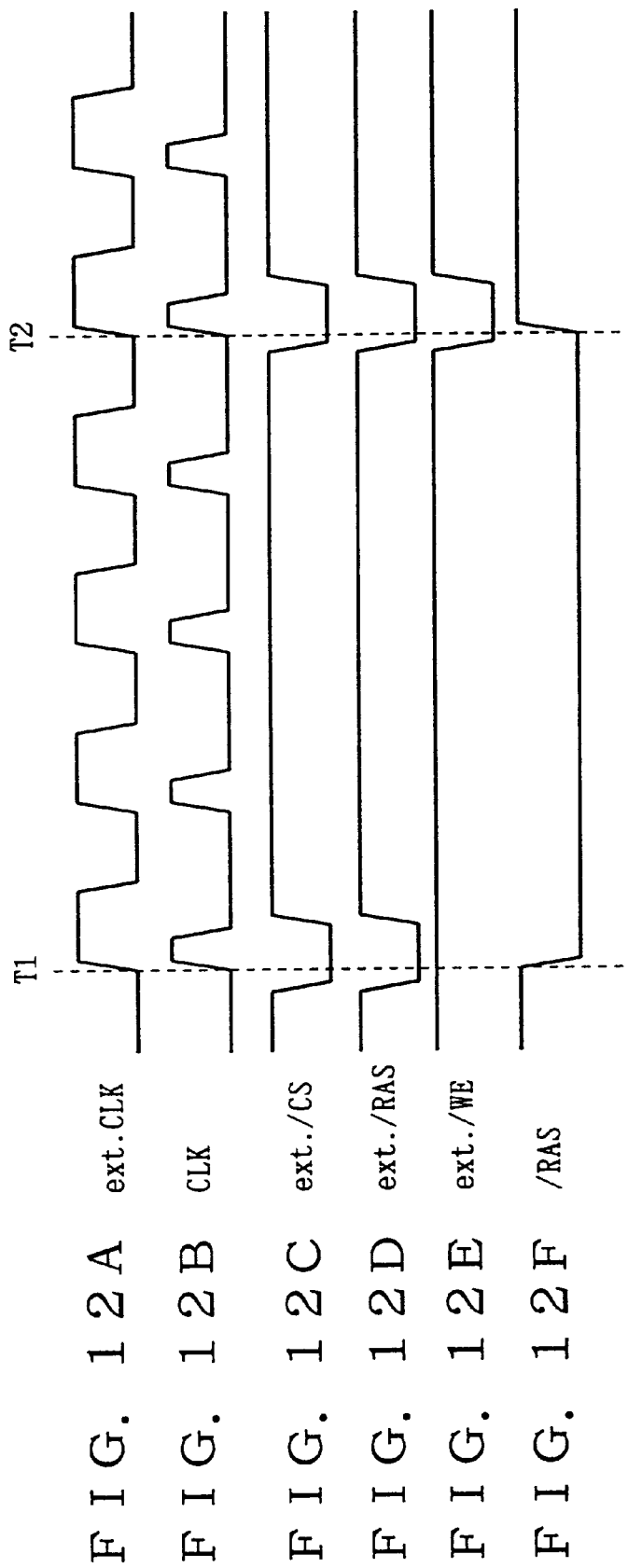

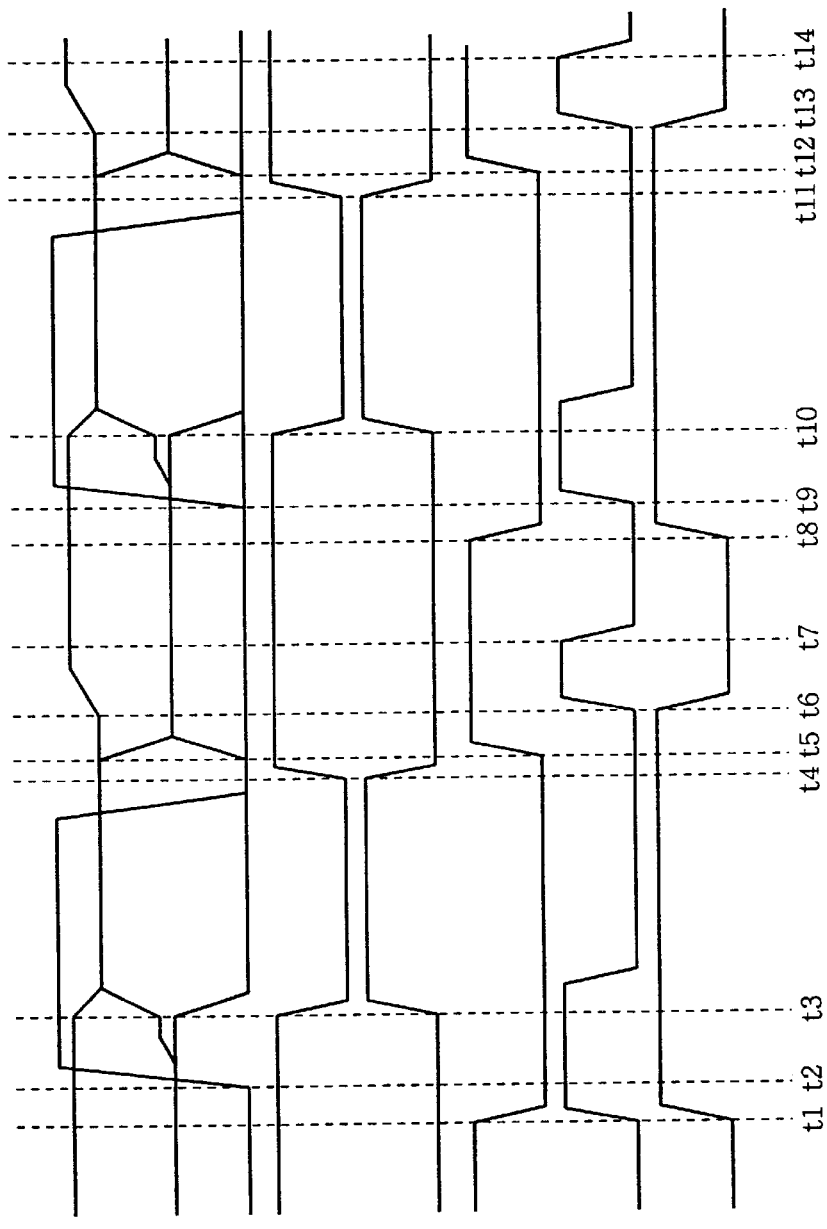
FIG. 15A Vccs
FIG. 15B BL,/BL
FIG. 15C WL
FIG. 15D SEP
FIG. 15E SEN
FIG. 15F BLEQ
FIG. 15G Vdce1
FIG. 15H Vdce2

FIG. 29A PRIOR ART Vccs
FIG. 29B PRIOR ART BL0,/BL0 BLn,/BLn
FIG. 29C PRIOR ART WL0
FIG. 29D PRIOR ART SEP
FIG. 29E PRIOR ART SEN
FIG. 29F PRIOR ART BLEQ
FIG. 29G PRIOR ART Vdce

VOLTAGE GENERATING CIRCUIT FOR SEMICONDUCTOR INTEGRATED CIRCUIT DEVICE

BACKGROUND OF THE INVENTION

1. Field of the Invention

The present invention relates to semiconductor integrated circuits, and more particularly to a circuit which generates internal power supply voltage supplied to sense amplifier.

2. Description of the Background Art

Conventionally, a semiconductor memory device has been operated by an internal power supply voltage which is generated by an incorporated internal voltage-down converter and is lower than the externally supplied power supply voltage in order to maintain its compatibility with conventional devices and also reduce power consumption.

FIGS. 26 and 27 are circuit diagrams showing configurations of conventional voltage-down converters shown in FIG. 69 and the like of Japanese Patent Laying-Open No. 3-214669. The voltage-down converter shown in FIG. 26 generates a power supply voltage for array Vccs and includes a node NVccs for the power supply voltage for array, a differential amplifier configured of transistors 1, 2, 5, 6 and 7, a differential amplifier configured of transistors 9, 10, 12, 13 and 14, a transistor 3, driver transistors 4 and 11, and a capacitor 8.

In this voltage-down converter, the differential amplifier configured of transistors 1, 2, 5, 6 and 7 compares power supply voltage for array Vccs with a reference voltage Vref (e.g. 2.0V). When power supply voltage for array Vccs is lower than reference voltage Vref, transistors 4 is turned on to connect node NVccs for the power supply voltage for array to an external power supply voltage (e.g. 3.3V) node NVcc and thus raise power supply voltage for array Vccs to reference voltage Vref. Thus, power supply voltage for array Vccs is maintained at the level of reference voltage Vref.

The differential amplifier configured of transistors 9, 10, 12, 13, and 14 operates in a similar manner to the differential amplifier described above, although transistors 9, 10, 12, 13 and 14 are smaller in size than transistors 1, 2, 5, 6 and 7 and thus provide less power consumption.

Thus, when the semiconductor memory device is in a stand-by state, an activation signal Vdce is controlled to attain a low (L) level and the differential amplifier configured of transistors 9, 10, 12, 13 and 14 only operates to reduce the power consumption of the semiconductor memory device in the stand-by state.

The voltage-down converter shown in FIG. 27 generates a voltage VBL the magnitude of which is half that of power supply voltage for array Vccs, and includes transistors 38–43.

FIG. 28 is a circuit diagram showing the configuration of a memory cell array portion of a conventional semiconductor memory device. As shown in FIG. 28, the memory cell array portion includes bit lines BL0 and BLn, inverted bit lines /BL0 and /BLn, a p-type sense amplifier configured of transistors 16–19, a transistor 15 supplying a power supply voltage for array Vccs to the p-type sense amplifier, an n-type sense amplifier configured of transistors 20–23, a transistor NT1 supplying a ground voltage to the n-type sense amplifier, a bit line equalization circuit configured of transistors 24–29, word lines WL0 and WLm, memory cells MC0 to MC3, and parasitic capacitances CB0 to CB2n+1. Memory cell MC0 includes a capacitor 34 and a transistor 30, memory cell MC1 includes a capacitor 35 and a transistor 31, memory cell MC2 includes a capacitor 36 and a transistor 32, and memory cell MC3 includes a capacitor 37 and a transistor 33.

Data of high (H) or L held in memory cells MC0 to MC3 correspond to power supply voltage for array Vccs or 0V applied to capacitors 34, 35, 36 and 37. The pairs of bit lines are precharged to attain an intermediate voltage (½Vccs, i.e., voltage VBL) in reading the data held in memory cells MC0 to MC3. Then, when word line WL0 is selected, for example, to connect capacitors 34 and 35 in memory cells MC0 and MC1 to bit lines BL0 and BLn. If capacitors 34 and 35 hold data of H, the voltage of bit lines BL0 and BLn exceeds voltage VBL. If capacitors 34 and 35 hold data of L, the voltage of bit lines BL0 and BLn drop below voltage VBL. Meanwhile, the voltages of inverted bit lines /BL0 and /BLn remain at voltage VBL and potential differences are caused between paired bit lines. The potential differences are amplified by the sense amplifiers to determine the data held in memory cells MC0 and MC1.

A data read operation when memory cells MC0 and MC1 hold data of H will now be described with reference to the timing charts shown in FIGS. 29A–29G. The state prior to time t1 is a stand-by state, and a bit line equalization signal BLEQ is at a high level, as shown in FIG. 29F, and paired bit lines BL0 and /BL0, and BLn and /BLn are precharged via transistors 24–29 to attain voltage VBL. When word line WL0 is activated to attain a high level at time t2, as shown in FIG. 29C, transistors 30 and 31 are turned on to allow the data of H to be transmitted on bit lines BL0 and BLn and the voltage of bit lines BL0 and BLn exceeds voltage VBL, as shown in FIG. 29B. Meanwhile, the voltage of inverted bit lines /BL0 and /BLn remains at voltage VBL and a potential difference is thus created between paired bit lines BL0, /BL0, BLn and /BLn. At time t3, sense amplifier activation signals SEP and SEN respectively attain a low level and a high level, as shown in FIGS. 29D and 29E, to turn on transistors 15 and NT1 and activate both the p-type sense amplifier configured of transistors 16–19 and the n-type sense amplifier configured of transistors 20–23. Thus, at time t4, the voltages of bit lines BL0 and BLn are raised to power supply voltage for array Vccs and the voltages of inverted bit lines /BL0 and /BLn are lowered from voltage VBL to the ground voltage. When the voltages of bit lines BL0 and BLn recover to the power supply voltage Vccs for array in the stand-by state, i.e. 2.0V, at time t5, the power supply voltage Vccs for array in the stand-by state, i.e. 2.0V, is rewritten into capacitors 34 and 35 as a holding voltage for capacitors 34 and 35 which have been lowered in reading the data.

For conventional semiconductor memory devices, however, the power supply voltage for array Vccs when the sense amplifiers operate drops from a predetermined level (2.0V) when the voltages of bit lines BL0 and /BLn are raised from voltage VBL at time t4, as shown in FIG. 29A. Then the voltage-down converter shown in FIG. 26 operates and the dropped power supply voltage for array Vccs thus recovers to the predetermined level, although the recovery requires a certain period of time. In other words, bit lines BL0 and BLn each attain a high level by supply of power supply voltage for array Vccs and accordingly the time for amplifying a potential difference of a pair of bit lines depends on the operating time of the voltage-down converter shown in FIG. 26. Thus, it has been difficult for conventional semiconductor memory devices to rapidly rewrite data into memory cells.

By contrast, Japanese Patent Laying-Open No. 6-215571 discloses the semiconductor memory device shown in FIG.

30. As shown in FIG. 30, the semiconductor memory device includes a pair of bit lines BL and /BL, word lines WL1 and WL2, a precharger circuit PC, input/output data lines I/O and /I/O, a sense amplifier, a node NVccs for power supply voltage for array, transistors Q2 and Q15, a voltage-down converter BVDL connected to node NVccs for power supply voltage for array, and a parasitic capacitance C1 connected to node NVccs for power supply voltage for array, wherein voltage-down converter BVDL includes transistors Q51–Q56.

An operation of the semiconductor memory device will now be described.

Parasitic capacitance C1 is charged to attain an external power supply voltage Vcc when transistor Q2 is turned on while transistor Q15 is turned off and the sense amplifier is inactivated. Then, when transistor Q15 is turned on and the sense amplifier is activated, the electric charge for charging a bit line is supplied from parasitic capacitance C1 and voltage-down converter VBDL. Thus, data is rewritten more rapidly in this semiconductor memory device than in the conventional semiconductor memory device described above. In the semiconductor memory device thus configured, however, it is not until the voltage at node NVccs for power supply voltage for array drops below a reference voltage VR that a differential amplifier of current mirror type (configured of transistors Q51–Q55) included in voltage-down converter BVDL turns on a driver transistor Q56 to accelerate charging the bit line. Since driver transistor Q56 has a large gate width and hence a large gate capacitance, it typically requires approximately 10 ns for the differential amplifier of current mirror type to lower the gate potential of driver transistor Q56 to completely turn on driver transistor Q56. Thus, even a semiconductor memory device thus configured cannot overcome the disadvantage that the time required for charging a bit line depends on the response speed of a differential amplifier of current mirror type.

SUMMARY OF THE INVENTION

One object of the present invention is to provide a semiconductor integrated circuit capable of rapidly rewriting data into memory cells.

A semiconductor integrated circuit in one aspect of the present invention includes: a pair of bit lines; a memory cell connected to the pair of bit lines; a sense amplifier which amplifies a potential difference between the pair of bit lines that is caused by reading data from the memory cell; and a sense amplifier driver circuit which supplies to the sense amplifier a largest voltage charged in the memory cell while the sense amplifier is activated. The sense amplifier driver circuit includes: an internal power supply node connected to the sense amplifier; a first voltage supply circuit which is connected to the internal power supply node and generates a first voltage which is higher than the largest voltage and does not depend on an external power supply voltage when a first activation signal is received, and supplies the first voltage to the internal power supply node; a second voltage supply circuit which is connected to the internal power supply node and generates and supplies the largest voltage to the internal power supply node; a decoupling capacitance which is connected to the internal power supply node and is charged to attain the first voltage while the sense amplifier is inactivated; and a control circuit which supplies the first activation signal to the first voltage supply circuit while the sense amplifier is inactivated.

A semiconductor integrated circuit in another aspect of the present invention includes: an external power supply voltage node; an internal voltage node; a driver transistor connected between the external power supply voltage node and the internal voltage node; a level shift circuit; and a differential amplifier connected to first and second output nodes of the level shift circuit and driving the driver transistor. The level shift circuit includes: a first transistor having the gate receiving a reference voltage; a second transistor having the gate receiving an internal voltage; a ground node; a third transistor connected between the drain of the first transistor and the ground node; a fourth transistor having the gate connected to the drain and gate to the third transistor and having the source connected to the ground node; a first output node connected to the drain of the third transistor; and a second output node connected to the drain of the fourth transistor.

An advantage of the present invention is that a largest voltage charged in a memory cell can be supplied to a sense amplifier while the sense amplifier is activated, to rapidly rewrite data into the memory cell.

Another advantage of the present invention is that a first voltage supply circuit can supply a first voltage rapidly to an internal power supply node.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A–4I are timing charts representing an operation of the circuit shown in FIG. 1.

FIG. 9 is a circuit diagram showing the configuration of a circuit for generating internal signal /RAS in a synchronous DRAM.

FIGS. 12A–12F are timing charts representing operations of the circuits shown in FIGS. 9–11.

FIGS. 15A–15H are timing charts representing an operation of the circuit shown in FIG. 13.

DESCRIPTION OF THE PREFERRED EMBODIMENTS

Figure 1:
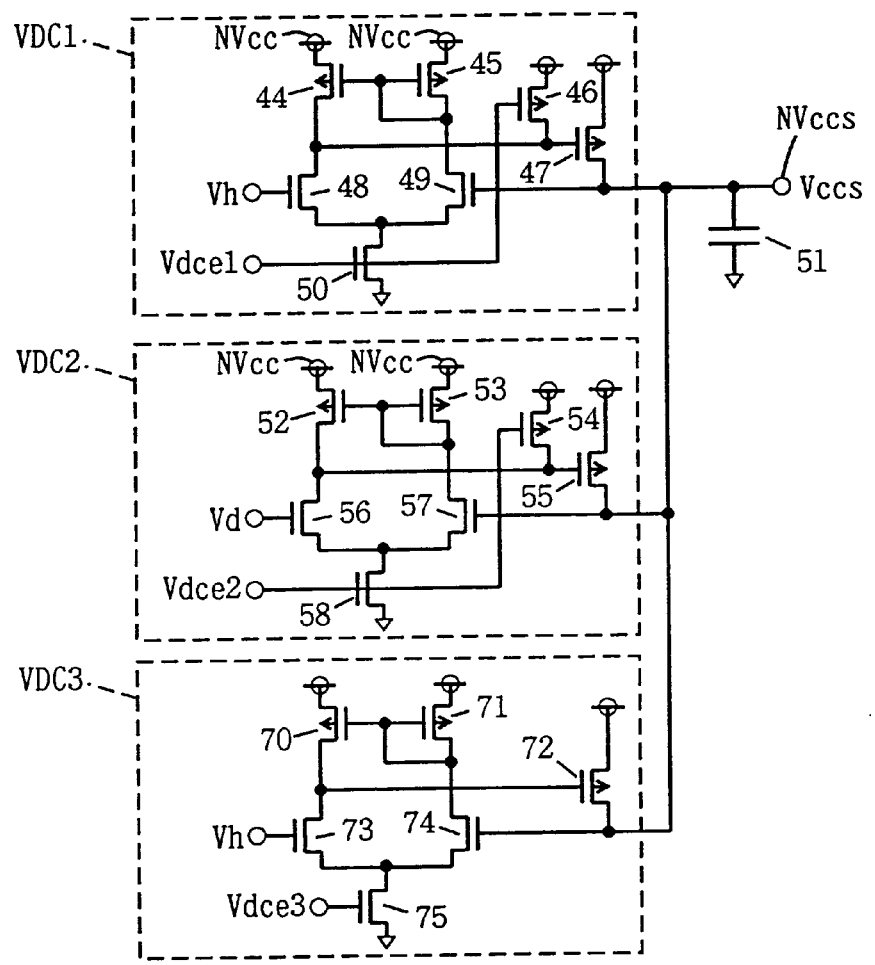
FIG. 1 is a circuit diagram showing the configuration of a circuit which generates a power supply voltage for array in a semiconductor integrated circuit according to a first embodiment of the present invention.

The embodiments of the present invention will now be specifically described with reference to the drawings. It should be noted that identical reference characters throughout the drawings denote identical or corresponding portions.

First Embodiment

FIG. 1 is a circuit diagram showing the configuration of a circuit which generates a power supply voltage for array Vccs in a semiconductor integrated circuit according to a first embodiment of the present invention. As shown in FIG. 1, the circuit includes: a node NVccs for the power supply voltage for array; a decoupling capacitance 51 connected to node NVccs for the power supply voltage for array and configured of e.g. a parasitic capacitance and the gate capacitance of a transistor; and voltage-down converters VDC1, VDC2 and VDC3 connected to node NVccs for the power supply voltage for array. Voltage-down converter VDC1 includes a differential amplifier configured of an external power supply voltage node Nvcc and transistors 44, 45, 48, 49 and 50, a transistor 46, and a driver transistor 47. Voltage-down converter VDC2 includes a differential amplifier configured of external power supply voltage node NVcc and transistors 52, 53, 56, 57 and 58, a transistor 54, and a driver transistor 55. Voltage-down converter VDC3 includes a differential amplifier configured of transistors 70, 71, 73, 74 and 75, and a driver transistor 72.

Figure 28:
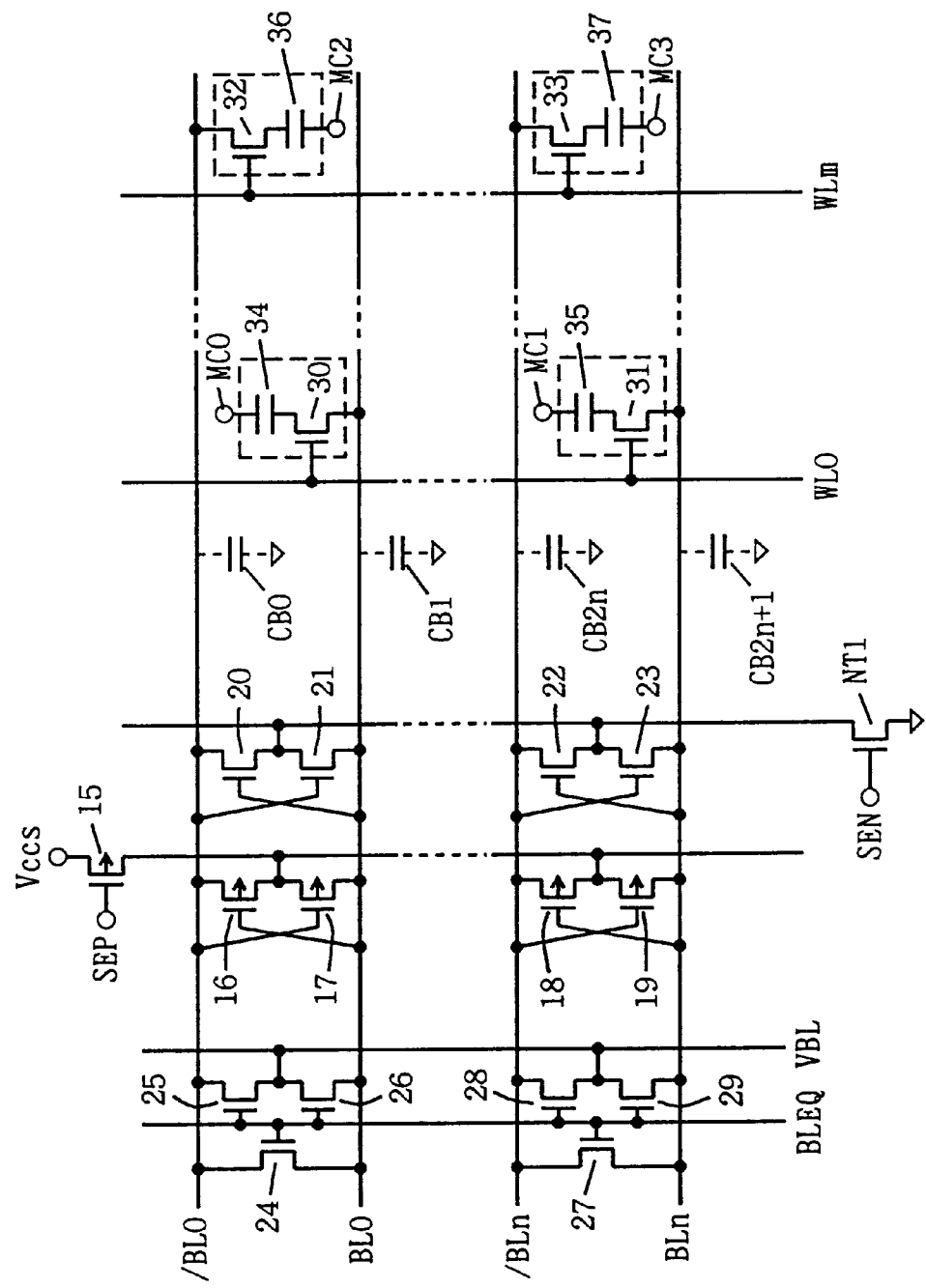
FIG. 28 is a circuit diagram showing the configuration of a conventional memory cell array portion of a semiconductor memory device.
Figure 29:
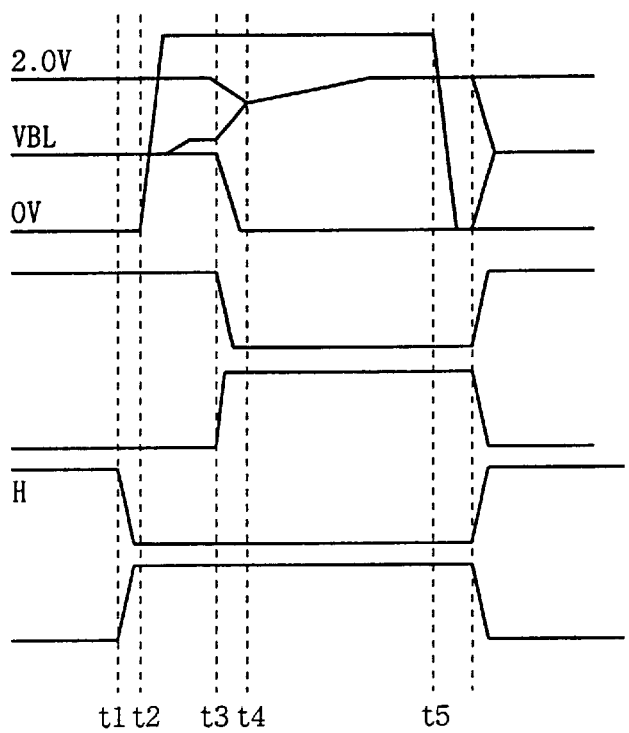
FIGS. 29A–29G are timing charts representing an operation of the semiconductor memory device shown in FIG. 28.

It should be noted that the magnitude of decoupling capacitance 51 is represented as Cd and the capacitance of a pair of bit lines shown in FIG. 28 is represented as Cb. It is also assumed that there are n pairs of bit lines.

It is also assumed that a holding voltage for a capacitor included in a memory cell is a voltage Vd for storing H data and 0V for storing L data.

In the standby state, bit lines are charged to attain an intermediate voltage VBL, (=½Vd), and decoupling capacitance 51 is charged to attain a voltage Vh which is higher than voltage Vd for writing H data.

When a sense amplifier operates, a bit line and decoupling capacitance 51 are connected via transistor 15 shown in FIG. 28. Thus, a H-level voltage on the bit line is equal to the voltage of decoupling capacitance 51 and this voltage serves as voltage Vd which writes H data into a memory cell. The value of voltage Vd is obtained from the equation Cb×n× VBL+Cd×Vh=(Cb×n+Cd)×Vd. Accordingly, if the magnitude Cd of the decoupling capacitance and voltage Vh for the precharging in the stand-by state are selected to satisfy $$Vd=(Cb\times n\times VBL+Cd\times Vh)/(Cb\times n+Cd) \qquad (1),$$

the bit line can rapidly be charged to attain the predetermined voltage Vd without depending on the operating time of the voltage-down converter in operation of the sense amplifier, as shown in the timing charts shown in FIGS. 4A and 4B. Thus, H data can rapidly be rewritten into a memory cell.

It should be noted that node NVccs for the power supply voltage for array receives voltages Vh, Vd and Vh from voltage-down converters VDC1, VDC2 and VDC3 activated in response to signals Vdce1, Vdce2 and Vdce3, respectively.

Figure 2:
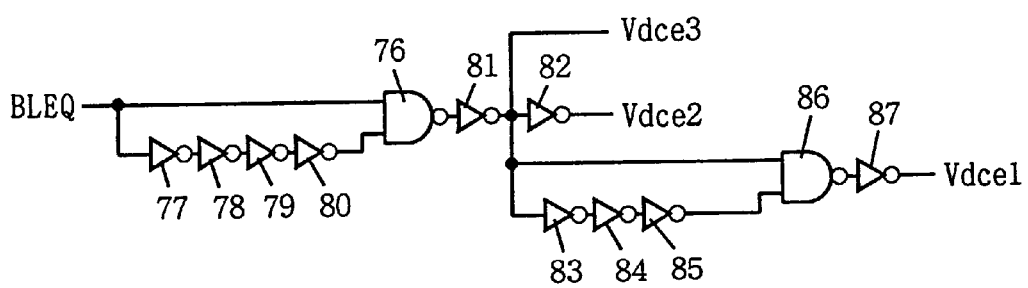
FIG. 2 is a circuit diagram showing the configuration of a circuit for generating the signals Vdce1, Vdce2 and Vdce3 shown in FIG. 1.

FIG. 2 is a circuit diagram showing the configuration of a circuit which generates the signals Vdce1, Vdce2 and Vdce3 shown in FIG. 1. As shown in FIG. 2, the circuit includes inverters 77–85 and 87 and NAND circuits 76 and 86, and signals Vdce1, Vdce2 and Vdce3 are generated based on bit line equalization signal BLEQ.

Figure 3:
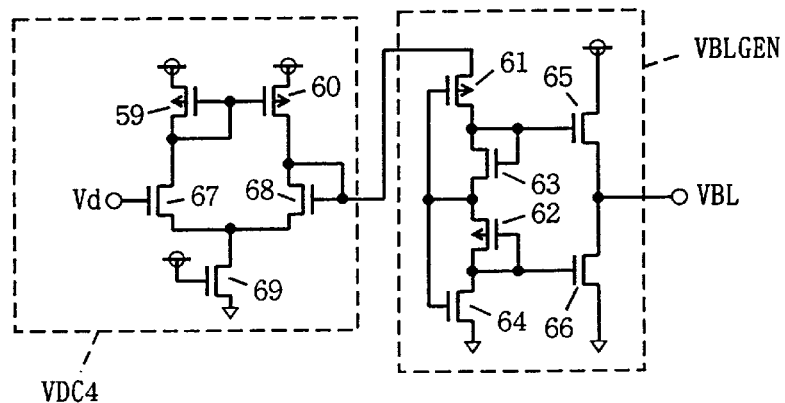
FIG. 3 is a circuit diagram showing the configuration of a circuit which generates a voltage for precharging a bit line in the semiconductor integrated circuit according to the first embodiment of the present invention.

FIG. 3 is a circuit diagram showing the configuration of a circuit which generates voltage VBL for precharging a bit line in the semiconductor integrated circuit according to the first embodiment of the present invention. As shown in FIG. 3, the circuit includes a voltage-down converter VDC4 and an intermediate voltage generation circuit VBLGEN connected to voltage-down converter VDC4. Voltage-down converter 4 includes a differential amplifier configured of transistors 59, 60, 67, 68 and 69, and intermediate voltage generation circuit VBLGEN includes transistors 61–66.

Voltage-down converter VDC4 is normally activated to supply voltage Vd to intermediate voltage generation circuit VBLGEN. Intermediate voltage generation circuit VBLGEN generates a voltage of ½ Vd as voltage VBL for precharging a bit line.

An operation of the semiconductor integrated circuit according to the first embodiment of the present invention will now be described with reference to the timing charts shown in FIGS. 4A–4I.

In a stand-by state prior to time t1, bit line equalization signal BLEQ is at a high level, as shown in FIG. 4F, and the pair of bit lines BLn and /BLn are charged to attain voltage VBL, as shown in FIG. 4B. Also, signal Vdce3 attains a high level, as shown in FIG. 4I, to activate voltage-down converter VDC3 which has a small driving capability. Thus, voltage Vh at node NVccs for the power supply voltage for array is prevented from dropping due to leakage of current, such as subthreshold current caused at a transistor.

At time t1, bit line equalization signal BLEQ attains a low level, as shown in FIG. 4F, and the pair of bit lines is thus placed in a floating state. Also, signal Vdce2 attains a high level, as shown in FIG. 4H, to activate voltage-down converter VDC2 which has a small driving capability.

At time t2, a word line WL is selected, as shown in FIG. 4C. At time t3, sense amplifier activation signals SEP and SEN attain low and high levels, as shown in FIGS. 4D and 4E, respectively. Thus, a sense amplifier amplifies the potential difference of a bit line pair to allow the voltage of the bit line to exceed voltage VBL. Since the bit line is charged by movement of the electric charge of decoupling capacitance 51, the voltage of node NVccs for the power supply voltage for array drops. However, voltage Vccs of node NVccs for the power supply voltage for array only drops to the level of voltage Vd, as shown in FIG. 4A, since the magnitude Cd of decoupling capacitance 51 and the magnitude of voltage Vh are set to satisfy equation (1).

Thus, a bit line can rapidly attain voltage Vd without depending on the response time of a voltage-down converter by contrast with conventional semiconductor memory devices and data can be rewritten into a memory cell more rapidly.

At time t4, the voltage level of word line WL attains a low level in a stand-by state, as shown in FIG. 4C, and a capacitor included in a memory cell is disconnected from a bit line. It should be noted that a prolonged period from time t3 to time t4 will not result in the magnitude of the voltage held in the capacitor included in the memory cell dropping below Vd at time t4 because of a voltage of a bit line that drops from a high level due to leakage current, since voltage-down converter VDC2 operates for that period.

At time t5, bit line equalization signal BLEQ attains a high level, as shown in FIG. 4F, to charge a pair of bit lines to attain voltage VBL. Also, as shown in FIGS. 4G and 4I, signal Vdce1 (and signal Vdce3) attains a high level at time t6 to activate voltage-down converter VDC1 of large driving capacity and node NVccs for the power supply voltage for array is thus boosted from voltage Vd to voltage Vh. At time t7, signal Vdc1 attains a low level, as shown in FIG. 4G, to inactivate voltage-down converter VDC1. Thus, only voltage-down converter VDC3 with small driving capability operates and the voltage of node NVccs for the power supply voltage for array is maintained at voltage Vh.

Thus, in the stand-by state, voltage-down converter VDC1 with large driving capability can be activated only for a certain period after changing into the stand-by state, such as the period from t6 to t7 shown in FIGS. 4A–4I, and only voltage-down converters VDC2 and VDC3 with small driving capability can operate for a period other than the certain period to reduce power consumption.

It should be noted that the length of the period from t6 to t7 for which voltage-down converter is activated is determined depending on the delay time of a delay circuit configured of inverters 83–85 shown in FIG. 2.

It should also be noted that the operation from time t8 to time t13 is similar to that from time t1 to time t6.

Figure 5:
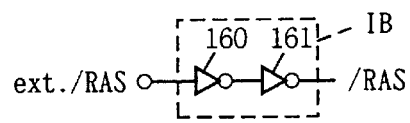
FIG. 5 is a circuit diagram showing the configuration of a circuit for generating an internal signal /RAS.
Figure 8:
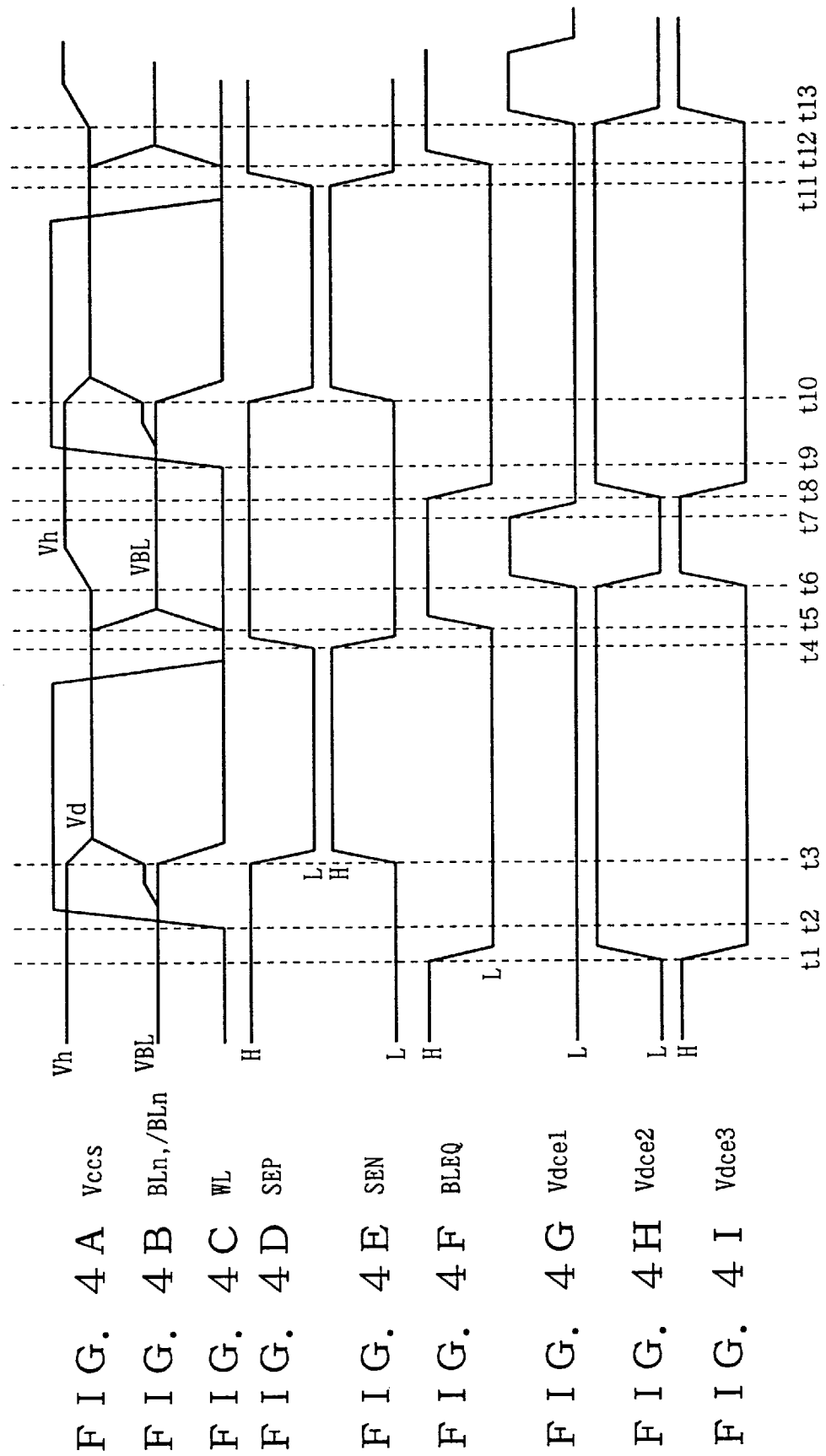
FIGS. 8A and 8B are timing charts representing an operation of the circuit shown in FIG. 5.

By contrast, for a standard DRAM, a signal ext./RAS which attains a high level in a stand-by state is input to a semiconductor integrated circuit, as shown in FIG. 8A. Signal ext./RAS is buffered at an input buffer IB shown in FIG. 5 to produce an internal signal /RAS shown in FIG. 8B. It should be noted that input buffer IB includes inverters 160 and 161.

Figure 6:
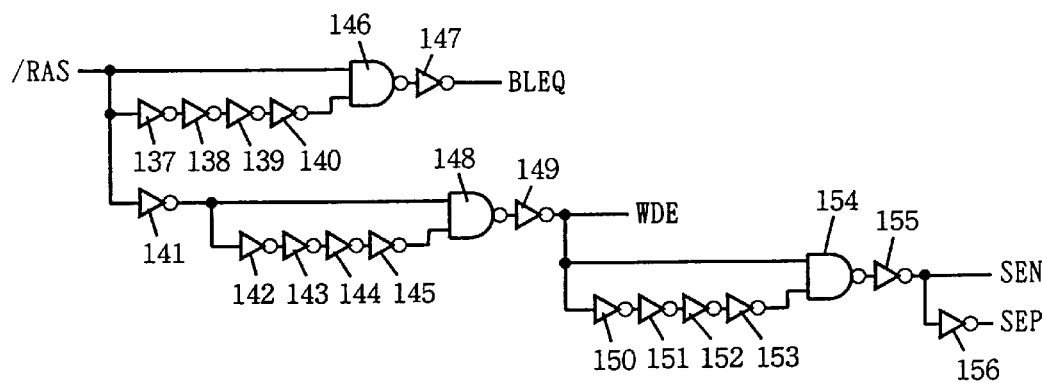
FIG. 6 is a circuit diagram showing the configuration of a circuit for generating a bit line equalization signal BLEQ, a word line driver activation signal WDE and a sense amplifier activation signals SEN and an SEP based on internal signal /RAS.

Based on internal signal /RAS, bit line equalization signal BLEQ, word line driver activation signal WDE and sense amplifier activation signals SEN and SEP are produced, as shown in FIG. 6. The circuit shown in FIG. 6 includes inverters 137–145, 147, 149–153, 155 and 156, and NAND circuits 146, 148 and 154.

Figure 7:
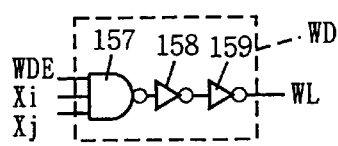
FIG. 7 is a circuit diagram showing a configuration of the word line driver.

Word line WL is selected by a word line driver WD in response to word line driver activation signal WDE and address signals Xi and Xj and word line driver WD includes an NAND circuit 157 and inverters 158 and 159, as shown in FIG. 7.

It should be noted that as shown in FIGS. 12A–12F, a synchronous DRAM has signal /RAS attaining an active low level from time T1, at which signals ext./CS and ext./RAS each attain a low level at a timing at which an internal clock signal CLK rises, until time T2, at which signals ext./CS, ext./RAS and ext./WE each attain a low level at a timing at which internal clock signal CLK rises. As shown in FIG. 9, signal /RAS is produced by a circuit which includes NAND circuits 203 and 204, NAND circuits 205 and 206 configuring a latch circuit, and an inverter 207. NAND circuit 203 receives signals CS0, RAS0, /CAS0 and /WE0, and NAND circuit 204 receives signals CS0, RAS0, /CAS0 and WE0. Signals CS0, RAS0, /CAS0, WE0 and /WE0 are produced by the circuit shown in FIG. 10, based on signals ext./RAS, ext./CAS, ext./WE and ext./CS. The circuit shown in FIG. 10 includes inverters 162–165, 169, 170, 173, 174, 176, 177, 180–182, 184, 186, 187, 190–192 and 194, transistors 166, 167, 171, 172, 178, 179, 188 and 189, and NAND circuits 168, 175, 183, 185 and 193. The clock signals CLK and /CLK shown in FIG. 10 are produced based on signal ext.CLK, as shown in FIG. 11, and the circuit shown in FIG. 11 includes inverters 195–199, 201 and 202 and an NAND circuit 200.

Figure 10:
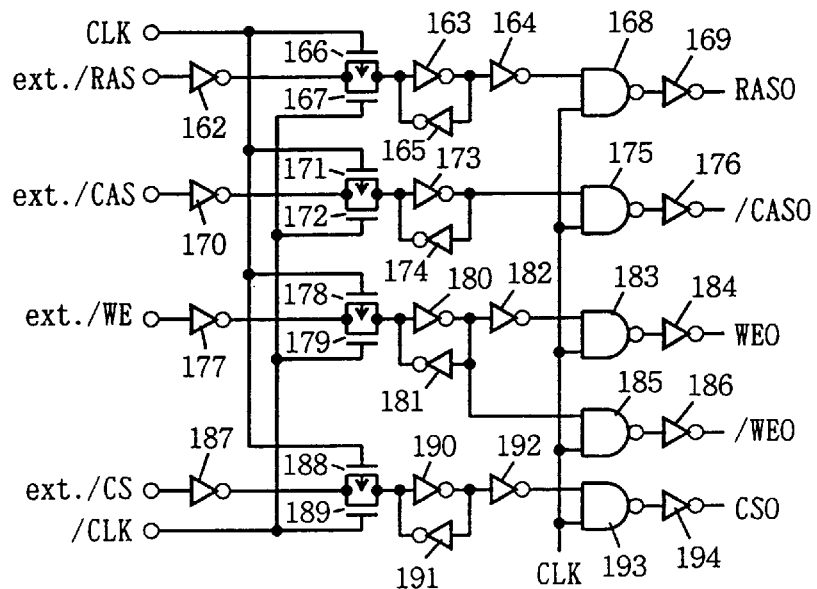
FIG. 10 is a circuit diagram showing the configuration of a circuit for generating the signals RAS0, /CAS0, WE0, /WE0 and CS0 shown in FIG. 9.
Figure 11:
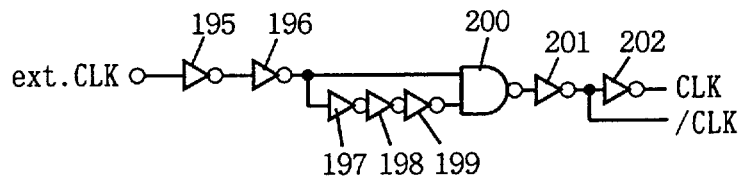
FIG. 11 is a circuit diagram showing the configuration of a circuit for generating the clock signals CLK and /CLK shown in FIG. 10.

In the circuit shown in FIG. 10, the respective states of signals ext./RAS, ext./CAS, ext./WE and ext./CS when clock signal CLK rises are held in latch circuits respectively configured of inverters 163 and 165, inverters 173 and 174, inverters 180 and 181 and inverters 190 and 191. The states held in these latch circuits are sampled according to clock signal CLK to produce signals RAS0, /CAS0, WE0, /WE0 and CS0.

A latch circuit shown in FIG. 9, configured of NAND circuits 205 and 206 and holding the state of signal /RAS, is set by an NAND circuit 203 which outputs a low-level signal during a low-level cycle of each of signals ext./CS and ext./RAS when clock signal CLK rises (i.e. time T1 shown in FIGS. 12A–12F). The latch circuit is reset by an NAND circuit 204 which outputs a low-level signal during a low-level cycle of each of signals ext. /CS, ext./RAS and ext./WE when clock signal CLK rises (i.e. time T2 shown in FIGS. 12A–12F).

It should be noted that bit line equalization signal BLEQ, word line driver activation signal WDE and sense amplifier activation signals SEN and SEP can be generated by the circuit shown in FIG. 6 based on signal /RAS, as in a standard DRAM.

Second Embodiment

Figure 13:
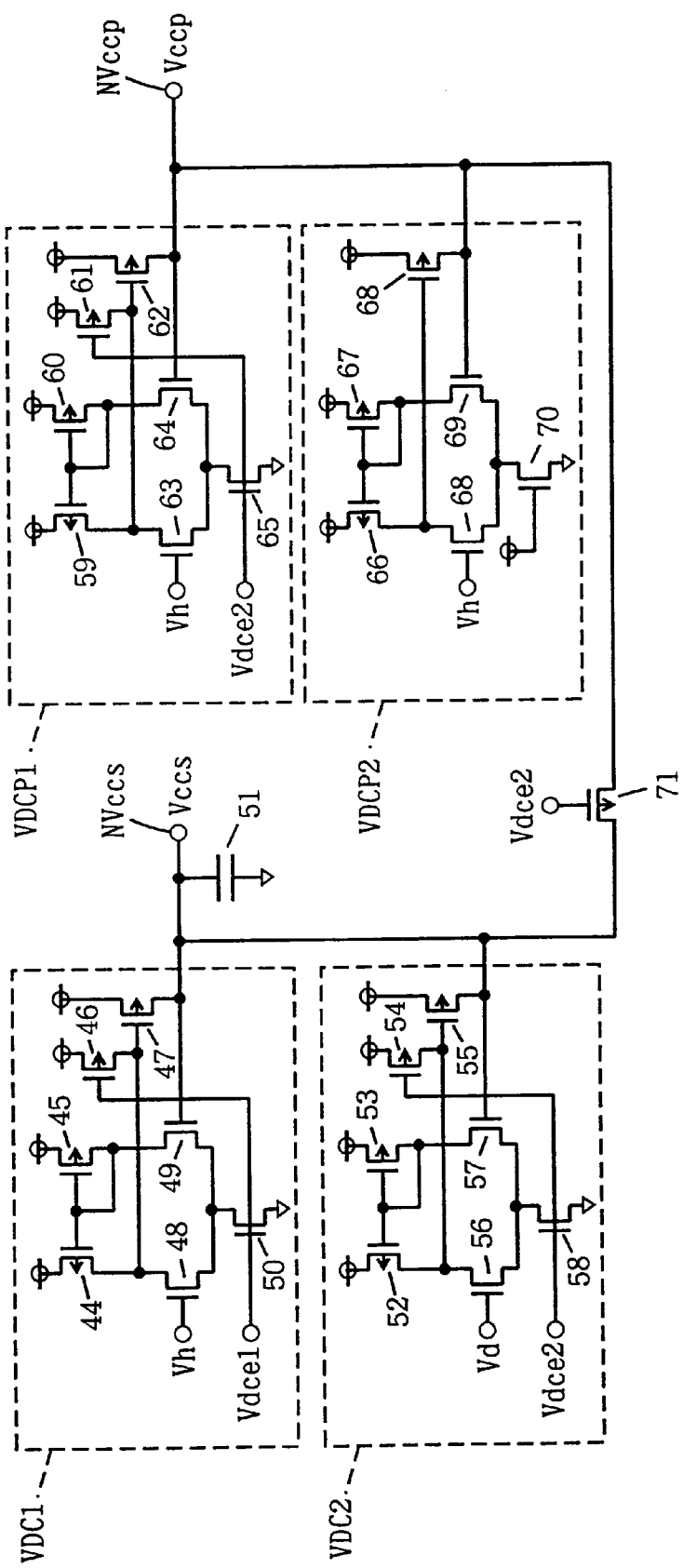
FIG. 13 is a circuit diagram showing a configuration of a semiconductor integrated circuit according to a second embodiment of the present invention.

FIG. 13 is a circuit diagram showing the configuration of a semiconductor integrated circuit according to a second embodiment of the present invention. As shown in FIG. 13, the semiconductor integrated circuit is similar in configuration to the semiconductor integrated circuit according to the first embodiment shown in FIG. 1, except that it does not include voltage-down converter VDC3 shown in FIG. 1 but includes an internal power supply voltage node for peripheral circuitry NVccp, a transistor 71 which is connected between internal power supply voltage node for peripheral circuitry NVccp and node NVccs for the power supply voltage for array and has its gate receiving signal Vdce2, and voltage-down converters VDCP1 and VDCP2 connected to internal power supply voltage node for peripheral circuitry NVccp.

Voltage-down converter VDCP1 includes a differential amplifier configured of transistors 59, 60 and 63–65, a transistor 61, and a driver transistor 62. Voltage-down converter VDCP2 includes a differential amplifier configured of transistors 60–70, and a driver transistor 68.

The gates of transistors 63 and 68 receive voltage Vh, the gates of transistors 61 and 65 receive signal Vdce2, and the gate of transistor 70 receives the power supply voltage.

Figure 14:
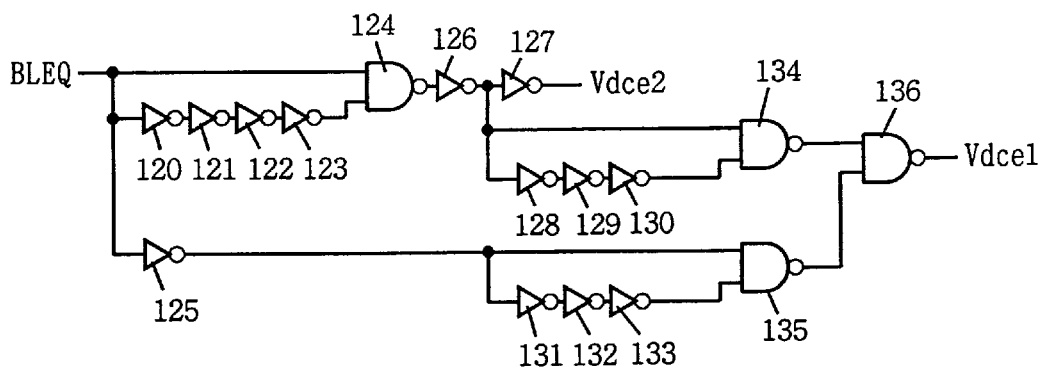
FIG. 14 is a circuit diagram showing the configuration of a circuit for generating the signals Vdce1 and Vdce2 shown in FIG. 13.

The signals Vdce1 and Vdce2 shown in FIG. 13 are produced by the circuit shown in FIG. 14, based on bit line equalization signal BLEQ. The circuit shown in FIG. 14 includes inverters 120–123 and 125–133 and NAND circuits 124 and 134–136.

FIGS. 15A–15H are timing charts representing an operation of the semiconductor integrated circuit according to the second embodiment.

For the semiconductor integrated circuit according to the second embodiment, if the chip area is small and the magnitude Cd of decoupling capacitance 51 cannot be large enough to satisfy equation (1), signal Vdce1 is maintained at a high level from activation of a sense amplifier (t3, t10) until a predetermined period elapses, as shown in FIG. 15G, to activate voltage-down converter VDC1.

Figure 30:
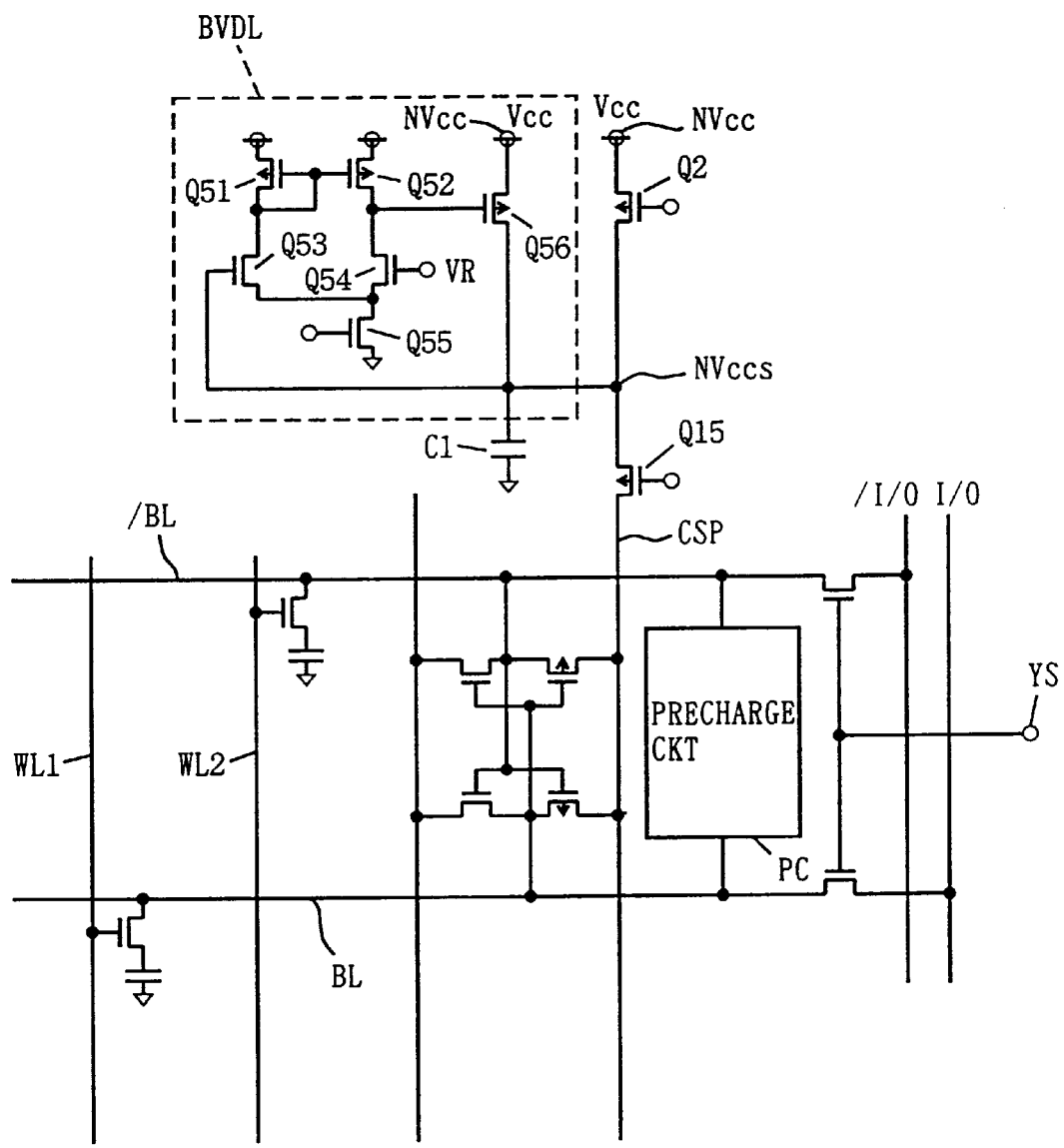
FIG. 30 is a circuit diagram showing another example of conventional semiconductor memory devices.

For the circuit shown in FIG. 30 disclosed in Japanese Patent Laying-Open No. 6-215571, increased external power supply voltage Vcc results in the potentials of the pair of bit lines BL and /BL exceeding a predetermined potential, unless the time required for connecting node NVccs for the power supply voltage for array to external power supply voltage node NVcc is reduced. Accordingly, the time required for connecting need precisely be adjusted depending on the magnitude of external power supply voltage Vcc. By contrast, the semiconductor integrated circuit according to the second embodiment has decoupling capacitance 51 charged to attain a fixed voltage Vd which does not depend on external power supply voltage Vcc. Thus, the time for which voltage-down converter VDC1 is operated after activation of a sense amplifier (i.e. after times t3 and t10) can be fixed regardless of the magnitude of external power supply voltage Vcc.

The fixed time which does not depend on the magnitude of external power supply voltage Vcc can readily be implemented by e.g. allowing voltage-down converters VDCP1 and VDCP2 to produce internal power supply voltage Vccp supplied to the peripheral circuitry depending on voltage Vh as reference, and using the internal power supply voltage Vccp to operate inverters 120–123, 125 and 126–133 and NAND circuits 124 and 134–136 shown in FIG. 14. Thus, the semiconductor integrated circuit according to the present embodiment provides an advantageous effect that the voltage supplied to a pair of bit lines can readily be adjusted, as compared with conventional circuits.

While voltage-down converter VDCP1 has a large driving capability and operates during active period (the periods from t1 to t6 and from t8 to t13 shown in FIGS. 15A–15H), voltage-down converter VDCP2, normally operating during the stand-by period of voltage down-converter VDCP1, has a small driving capability and thus provides small power consumption.

Furthermore, signal Vdce2 which attains a low level while voltage-down converters VDC2 and VDCP1 are each placed in a stand-by state allows transistor 71 shown in FIG. 13 to connect node NVccs for the power supply voltage for array and node NVccp for the internal power supply voltage for peripheral circuitry together, and the voltage of node NVccs for the power supply voltage for array is maintained at the level of voltage Vh by voltage-down converter VDCP2 while voltage-down converters VDC2 and VDCP1 are each in a stand-by state.

Thus, the semiconductor integrated circuit according to the second embodiment can have voltage-down converter VDCP2 shared for preventing the voltages of node NVccs for the power supply voltage for array and node NVccp for the internal power supply voltage for peripheral circuitry in the stand-by state from dropping due to leakage current, to reduce power consumption in the stand-by state and reduce chip area.

Third Embodiment

Figure 16:
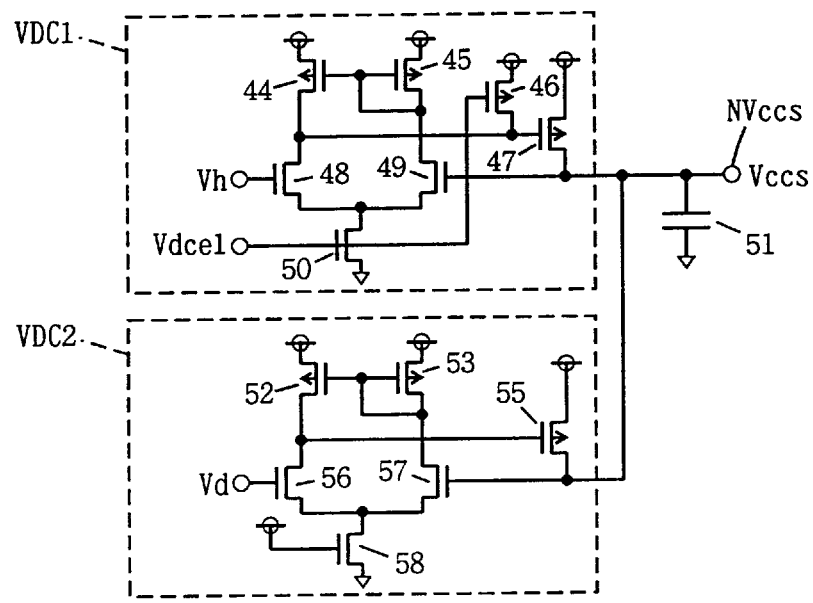
FIG. 16 is a circuit diagram showing the configuration of a circuit which generates a power supply voltage for array in a semiconductor integrated circuit according to a third embodiment of the present invention.

FIG. 16 is a circuit diagram showing the configuration of a semiconductor integrated circuit according to a third embodiment of the present invention.

As shown in FIG. 16, the semiconductor integrated circuit according to the third embodiment is similar in configuration to that shown in FIG. 1, except that it does not include voltage-down converter VDC3 shown in FIG. 1, voltage-down converter VDC2 does not include transistor 54 and that the gate of transistor 58 receives external power supply voltage Vcc.

Figure 17:
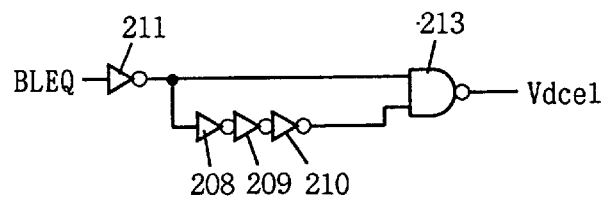
FIG. 17 is a circuit diagram showing the configuration of a circuit for generating the signal Vdec1 shown in FIG. 16.

The signal Vdce1 applied to the gates of transistors 46 and 50 shown in FIG. 16 is produced based on bit line equalization signal BLEQ by the circuit shown in FIG. 17, which includes inverters 208–211 and an NAND circuit 213.

Figure 18:
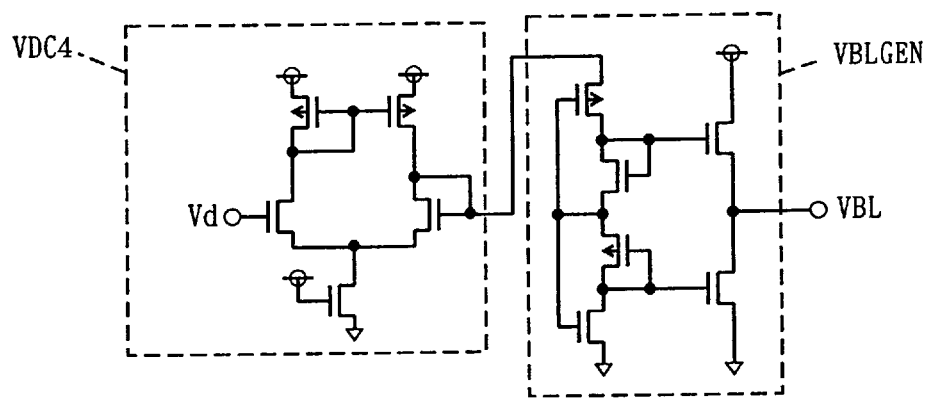
FIG. 18 is a circuit diagram showing the configuration of a circuit which generates a voltage for precharging a bit line in the semiconductor integrated circuit according to the third embodiment of the present invention.

FIG. 18 is a circuit diagram showing the configuration of a voltage VBL generation circuit according to the third embodiment. As shown in FIG. 18, the circuit is similar in configuration to the circuit according to the first embodiment shown in FIG. 3.

In the circuit described above, voltage-down converter VDC1 supplies voltage Vh to node NVccs for the power supply voltage for array when it is activated in response to signal Vdce1, and voltage-down converter VDC2 normally supplies voltage Vd to node NVccs for the power supply voltage for array.

Voltage-down converter VDC4 shown in FIG. 18 supplies voltage Vd to intermediate voltage generation circuit VBLGEN which in turn generates voltage VBL.

FIGS. 19A–19G are timing charts representing an operation of the semiconductor integrated circuit according to the third embodiment shown in FIG. 16.

Figure 19:
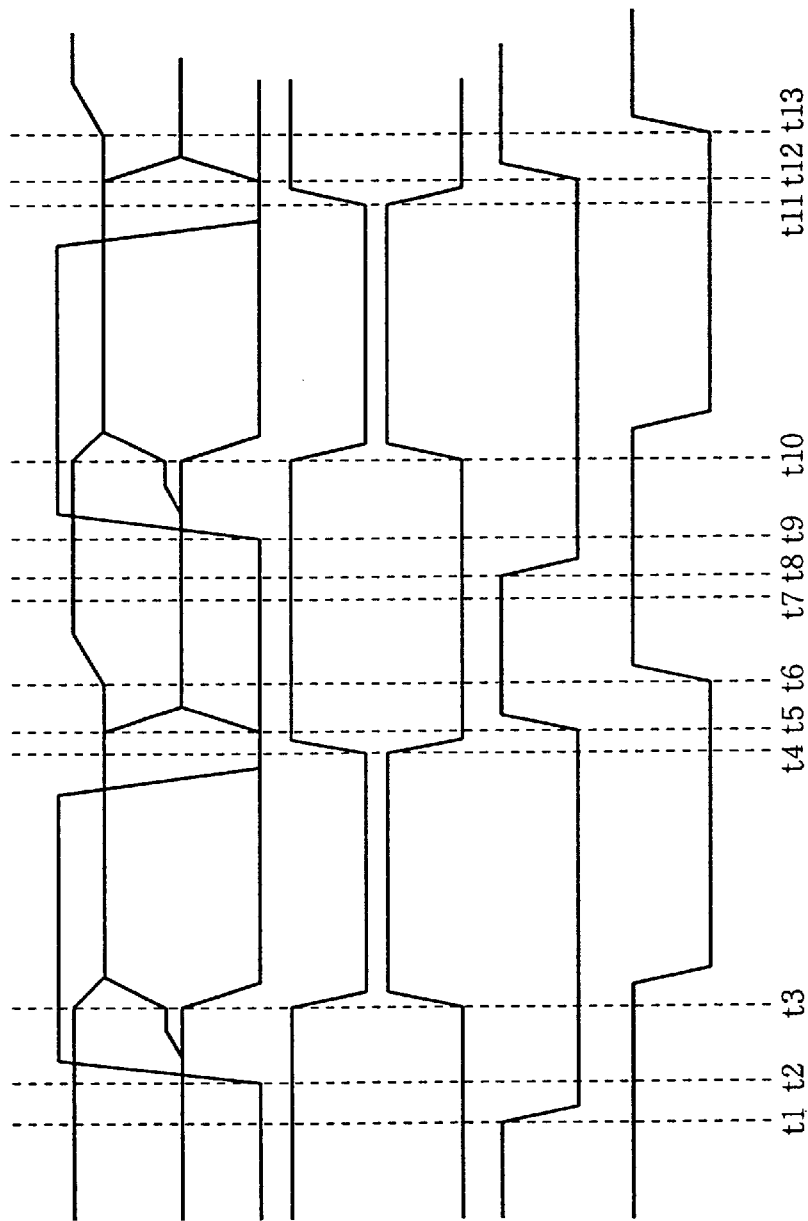
FIGS. 19A–19G are timing charts representing an operation of the circuit shown in FIG. 16.

As shown in FIG. 19G, signal Vdce1 attains a high level for a certain period after times t1 and t8 at which bit line equalization signal BLEQ represented in FIG. 19F changes its level from a high level to a low level.

If the magnitude Cd of decoupling capacitance 51 and voltage Vh can satisfy equation (1), signal Vdce1 attains a low level prior to activation of a sense amplifier to inactivate voltage-down converter VDC1. If the magnitude Cd of decoupling capacitance 51 and voltage Vh cannot satisfy equation (1), signal Vdce1 is maintained at a high level for a certain period even after activation of the sense amplifier (times t3 and t10), as shown in FIG. 19G, by adjusting the delay time of inverters 208–210 shown in FIG. 17.

Fourth Embodiment

Figure 20:
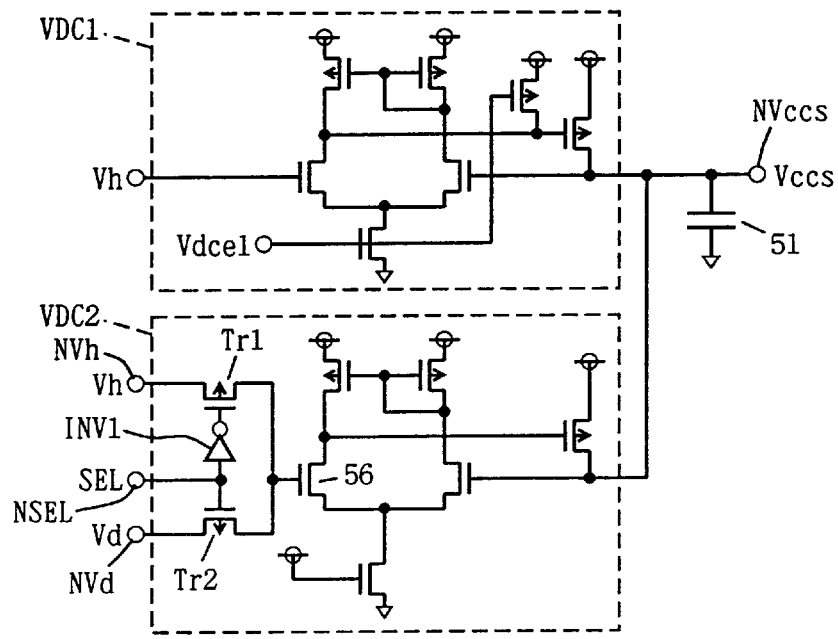
FIG. 20 is a circuit diagram showing the configuration of a circuit which generates a power supply voltage for array in a semiconductor integrated circuit according to a fourth embodiment of the present invention.

FIG. 20 is a diagram showing the configuration of a semiconductor integrated circuit according to a fourth embodiment of the present invention.

As shown in FIG. 20, the semiconductor integrated circuit is similar in configuration to that shown in FIG. 16, except for the configuration of voltage-down converter VDC2.

More specifically, the semiconductor integrated circuit according to the present embodiment further includes a node NVh receiving voltage Vh, a transistor Tr1 connected between node NVh and the gate of a transistor 56, a node NVd receiving voltage Vd, a transistor Tr2 connected between node NVd and the gate of transistor 56, an inverter INV1 having an input node connected to the gate of transistor Tr2 and having an output node connected to the gate of transistor Tr1, and a node NSEL receiving signal SEL and connected to the gate of transistor Tr2.

Figure 21:
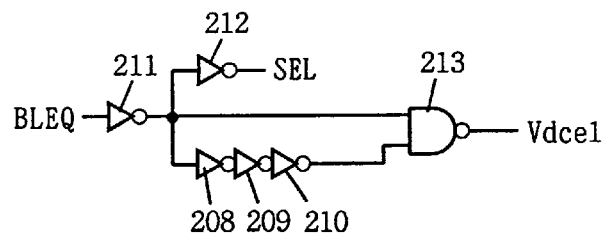
FIG. 21 is a circuit diagram showing the configuration of a circuit for generating the signals SEL and Vdce1 shown in FIG. 20.

Signals Vdce1 and SEL are produced based on bit line equalization signal BLEQ by the circuit shown in FIG. 21, which includes inverters 208–212 and an NAND circuit 213.

Figure 22:
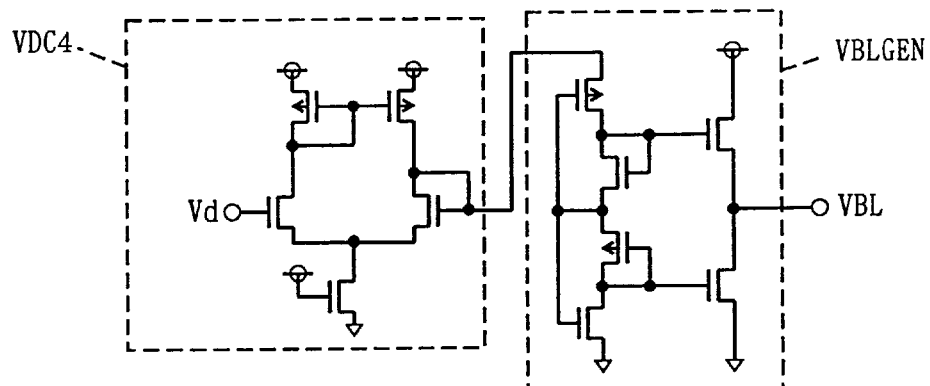
FIG. 22 is a circuit diagram showing the configuration of a circuit which generates a voltage for precharging a bit line in a semiconductor integrated circuit according to the fourth embodiment of the present invention.

The present embodiment is also provided with the same circuit as the voltage VBL generation circuit shown in FIG. 18, as shown in FIG. 22.

FIGS. 23A–23G are timing charts representing an operation of the semiconductor integrated circuit according to the fourth embodiment shown in FIG. 20.

Voltage-down converter VCD1 is similar to the semiconductor integrated circuit according to the first or second embodiment in that voltage-down converter VDC1 is activated in response to signal Vdce1 of high level to supply voltage Vh to node NVccs for the power supply voltage for array.

Figure 23:
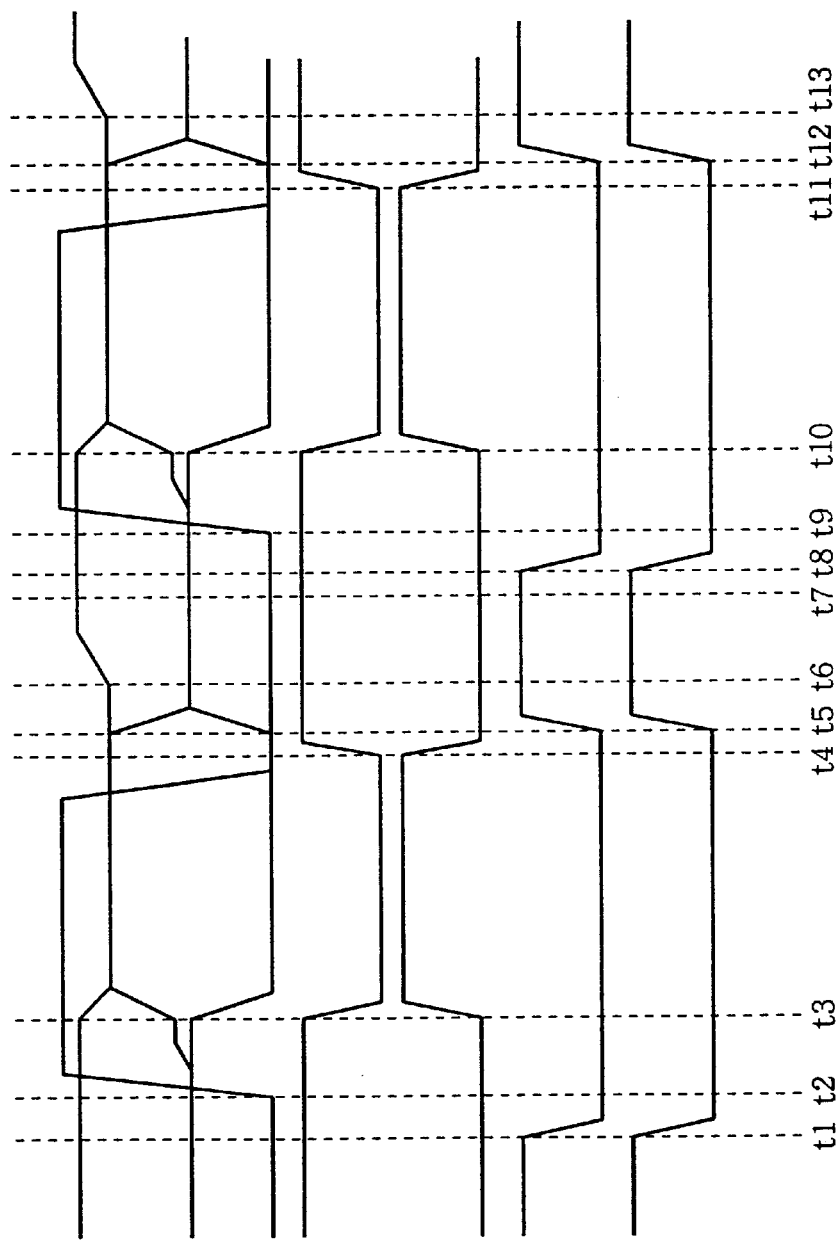
FIGS. 23A–23G are timing charts representing an operation of the circuit shown in FIG. 20.

Voltage-down converter VDC2 is normally activated. However, since signal SEL attains a high level in a stand-by state and a low level in a select operation, as shown in FIG. 23G, node NVccs for the power supply voltage for array receives voltage Vh in the stand-by state and voltage Vd in the select operation.

Thus, the semiconductor integrated circuit according to the fourth embodiment has voltage-down converter VDC2 also having the functions of voltage-down converters VDC3 and VDC2 in the first embodiment and the functions of voltage-down converters VDCP2 and VDC2 in the second embodiment.

Fifth Embodiment

Figure 24:
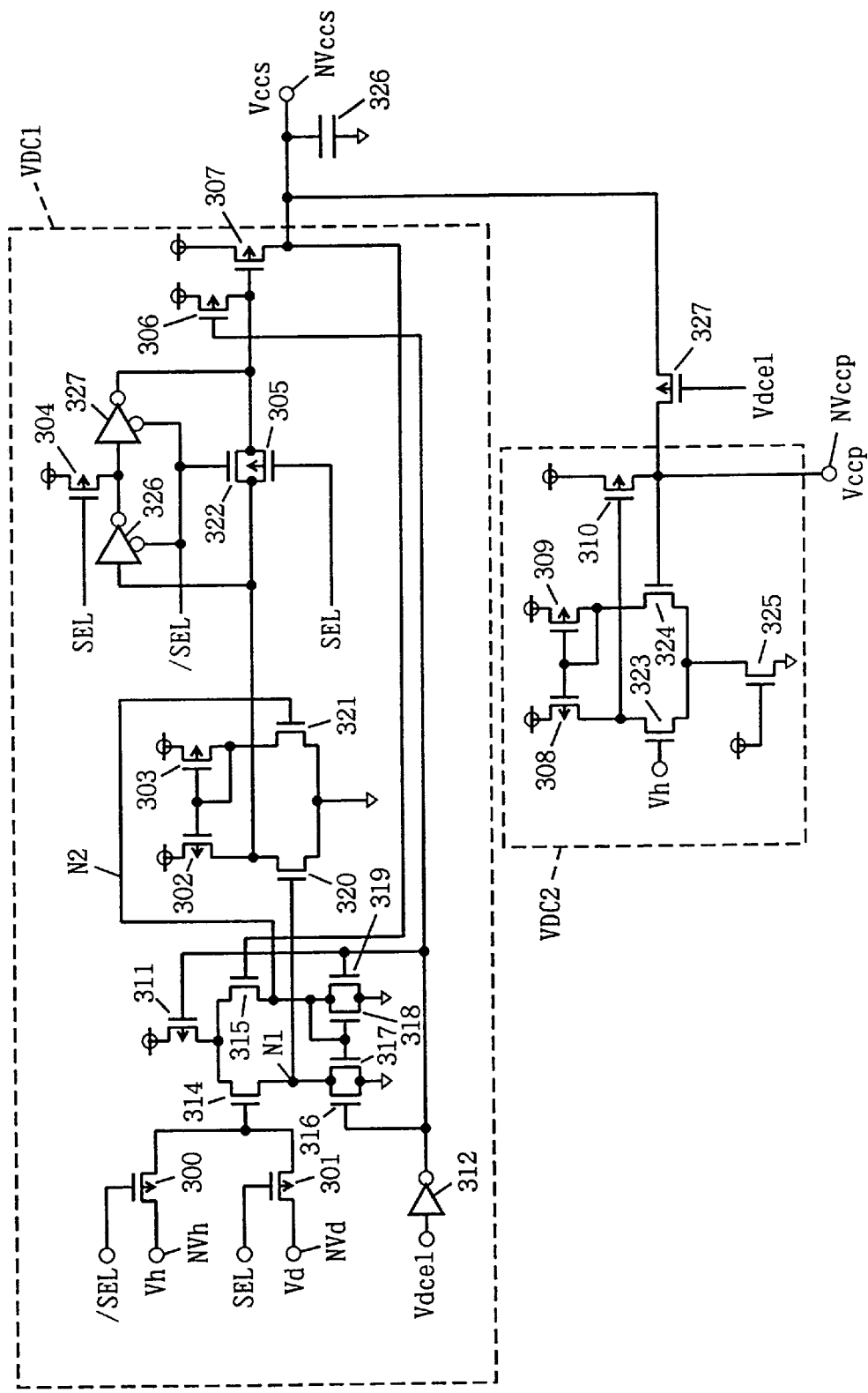
FIG. 24 is a circuit diagram showing the configuration of a semiconductor integrated circuit according to a fifth embodiment of the present invention.

FIG. 24 is a circuit diagram showing the configuration of a semiconductor integrated circuit according to a fifth embodiment of the present invention. As shown in FIG. 24, the circuit includes node NVccs for the power supply voltage for array, a decoupling capacitance 326 connected to node NVccs for the power supply voltage for array, voltage-down converter VDC1 connected to node NVccs for the power supply voltage for array, voltage-down converter VDC2, a transistor 327 connected between node NVccs for the power supply voltage for array and voltage-down converter VDC2 and having the gate receiving signal Vdce1, and a node NVccp for the internal power supply voltage for peripheral circuitry.

Voltage-down converter VDC1 includes a level shifter configured of transistors 311 and 314–319, a node NVh receiving voltage Vh, a transistor 300 connected between node NVh and the gate of transistor 314 and having the gate receiving signal /SEL, a transistor 301 connected between node NVd and the gate of transistor 314 and having the gate receiving signal SEL, an inverter 312 receiving signal Vdce1, a differential amplifier configured of transistors 302, 303, 320 and 321, transistors 304–306 and 322, clocked inverters 326 and 327, and a driver transistor 307.

Voltage-down converter VDC2 includes a differential amplifier configured of transistors 308, 309, 323, 324 and 325, and a driver transistor 310.

FIGS. 25A–25H are timing charts representing an operation of the semiconductor integrated circuit according to the fifth embodiment.

Figure 25:
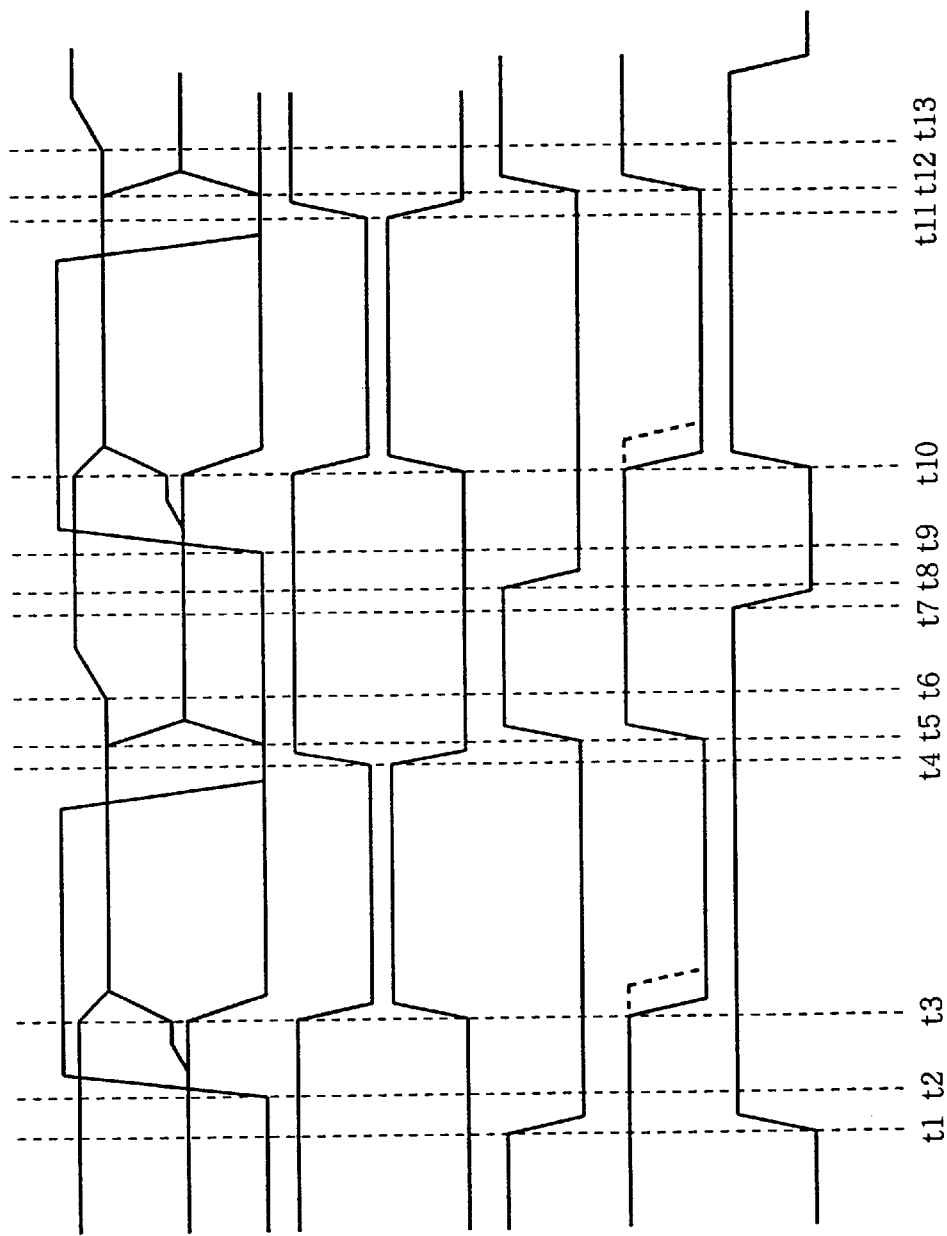
FIGS. 25A–25H are timing charts representing an operation of the circuit shown in FIG. 24.
Figure 26:
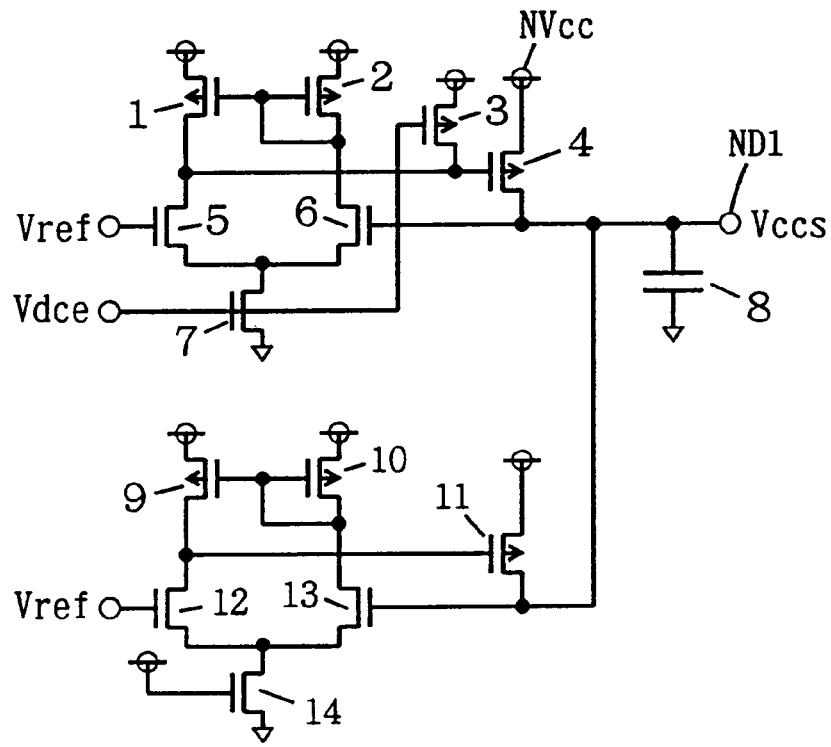
FIG. 26 is a circuit diagram showing the configuration of a conventional circuit for generating a power supply voltage for array.
Figure 27:
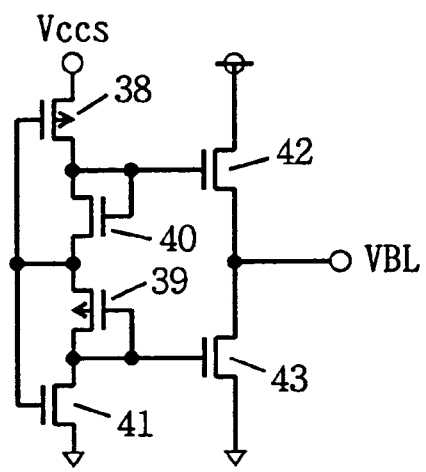
FIG. 27 is a circuit diagram showing the configuration of a conventional circuit which generates a voltage for precharging a bit line.

As shown in FIG. 25H, signal Vdce1 is at a high level for a select operation period (time t1 through t5) and a certain period after the current state is changed to a stand-by state (time t5 through t7) and voltage-down converter VDC1 is thus activated for those periods of time. As shown in FIG. 25G, signal SEL is at a high level for a certain period after the current state is changed to a stand-by state (time t5 through t8) and a certain period after entering a select operation (time t8 through t10) so that transistor 300 is turned on and voltage-down converter VDC1 supplies voltage Vh to node NVccs for the power supply voltage for array. When signal SEL is at a low level, transistor 301 is turned on and voltage-down converter VDC1 supplies voltage Vd to node NVccs for the power supply voltage for array.

When a certain period elapses after a state is changed to a stand-by state (time t7), signal Vdce1 attains a low level, as shown in FIG. 25H, to inactivate voltage-down converter VDC1. However, transistor 327 is turned on to connect voltage-down converter VDC2 of small driving capacity to node NVccs for the power supply voltage for array so that the voltage of node NVccs for the power supply voltage for array is maintained at voltage Vh.

If the magnitude of decoupling capacitances 326 does not satisfy equation (1), the timing at which signal SEL attains a low level can be delayed as indicated by the broken line shown in FIG. 25G to obtain an effect similar to that provided by the semiconductor integrated circuit according to the second embodiment.

Transistors 300 and 301 switch between voltages Vh and Vd serving as a reference and the level shifter shifts the voltage of an input signal to an operating point which provides high gain of the differential amplifier. Thus, the output amplitude of the differential amplifier is increased and the driving capability of driver transistor 307 is enhanced.

When the gate voltage of transistors 314 is higher than that of transistor 315 in the level shifter configured of transistors 314, 315, 317 and 318, the current flowing through transistor 318 is increased and the gate voltage of transistor 318 (the voltage of output node N2) is raised. Then, the channel resistance of transistor 317 is reduced and the drain voltage of transistor 317 (the voltage of output node N1) is decreased. Thus, output nodes N1 and N2 of the level shifter output voltage the difference between which is larger than that between the gate voltages of transistors 314 and 315 input to the level shifter.

Thus, the level shifter configured of transistors 314, 315, 317 and 318 effectively optimizes the operating point while increasing the gain.

Furthermore, the differential amplifier configured of transistors 302, 303, 320 and 321 has, by contrast with the differential amplifier configured of transistors 308, 309, 323, 324 and 325, the sources of transistors 320 and 321 connected to a ground node, and an output voltage of the differential amplifier is lowered by the amount corresponding to the voltage between the drain and source of transistor 325. Thus, transistor 307 can be rendered more conductive to obtain an internal voltage-down converter with high driving capability.

When signal SEL attains a low level, the clocked inverters 326 and 327 are inactivated and driver transistor 307 is thus driven by an output voltage from the differential amplifier in an analog manner. When signal SEL attains a high level, transistors 305 and 322 are turned off and clocked inverters 326 and 327 are also activated so that driver transistor 307 is digitally driven to rapidly charge node NVcss for the power supply voltage for array.

While voltage-down converter VDC2 functions so that it supplies internal power supply voltage Vccp to peripheral circuitry, it is also connected to node Nvccs for the power supply voltage for array while signal Vdce1 shown in FIG. 25H is at a low level to turn on transistor 327.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:

an external power supply voltage node;

an internal voltage node;

a driver transistor connected between said external power supply voltage node and said internal voltage node;

a level shift circuit including (a) a first transistor having its gate receiving a reference voltage, (b) a second transistor having its gate receiving an internal voltage, (c) a ground node, (d) a third transistor connected between the source of said first transistor and said ground node, (e) a fourth transistor having its drain and gate connected to the gate of said third transistor and the source of said second transistor, and having its source connected to said ground node, (f) a first output node connected to the drain of said third transistor, and (g) a second output node connected to the drain of said fourth transistor; and a differential amplifier connected to said first and second output nodes of said level shift circuit and driving said driver transistor.

2. The semiconductor integrated circuit according to claim 1, wherein said differential amplifier includes:

a fifth transistor having its gate connected to said first output node and having its source connected to said ground node;

a sixth transistor having its gate connected to said second output node and having its source connected to said ground node;

a seventh transistor connected between the drain of said fifth transistor and said external power supply voltage node; and an eighth transistor having its gate and drain connected to the gate of said seventh transistor and the drain of said sixth transistor, and having its source connected to said external power supply voltage node.

* * * * *